US005546036A

United States Patent [19]

Sommer et al.

[11] Patent Number: 5,546,036
[45] Date of Patent: Aug. 13, 1996

[54] CIRCUIT ARRAY FOR AMPLIFYING AND HOLDING DATA WITH DIFFERENT SUPPLY

[75] Inventors: Diether Sommer, Munich; Dominique Savignac, Ismaning; Dieter Gleis, Grosskarolinenfeld, all of Germany

[73] Assignee: Siemens Aktiengesellschaft, Munich, Germany

[21] Appl. No.: 376,683

[22] Filed: Jan. 23, 1995

Related U.S. Application Data

[63] Continuation of Ser. No. 118,028, Sep. 8, 1993, abandoned.

[30] Foreign Application Priority Data

Aug. 27, 1992 [EP] European Pat. Off. .............. 92114662

[51] Int. Cl.$^6$ ................................................. H03K 3/286
[52] U.S. Cl. ........................... 327/208; 327/55; 327/203; 327/215
[58] Field of Search ................................. 307/272.1, 279, 307/530, 289, 290, 291; 365/203, 205, 207; 327/185, 55, 199, 1, 203, 206, 208, 1, 215, 218, 219, 223, 227, 228

[56] References Cited

U.S. PATENT DOCUMENTS

| | | | |
|---|---|---|---|
| 4,288,706 | 9/1981 | Reese et al. | 307/279 |
| 4,356,411 | 10/1982 | Suzuki et al. | 307/279 |
| 4,512,029 | 4/1985 | Brice | 307/279 |
| 4,542,306 | 9/1985 | Ikeda | 307/279 |
| 4,644,185 | 2/1987 | Todo | 307/279 |
| 4,701,889 | 11/1987 | Ando | 365/203 |
| 4,845,675 | 7/1989 | Krenik et al. | 365/205 |
| 4,910,417 | 3/1990 | El Gamal et al. | 307/243 |
| 4,929,850 | 5/1990 | Brenninger | 307/272.1 |
| 5,036,217 | 7/1991 | Rollins et al. | 307/291 |
| 5,103,116 | 4/1992 | Sivilotti et al. | 307/279 |
| 5,128,896 | 7/1992 | Yamada et al. | 365/203 |
| 5,228,106 | 7/1993 | Ang et al. | 315/203 |

FOREIGN PATENT DOCUMENTS

| | | |
|---|---|---|
| 0329910 | 8/1989 | European Pat. Off. . |
| 0464468 | 1/1992 | European Pat. Off. . |
| 2665012 | 1/1992 | France . |

OTHER PUBLICATIONS

"Halbleitet–Schaltungstechniu"Tietze–Schenk, Springet Vetlag, pp. 162–189.

Primary Examiner—Timothy P. Callahan
Assistant Examiner—T. Lam
Attorney, Agent, or Firm—Herbert L. Lerner; Laurence A. Greenberg

[57] ABSTRACT

A circuit array for amplifying and holding data with different supply voltages includes a first flip-flop being constructed in MOS technology for receiving a low supply voltage and data with a low supply voltage. The first flip-flop has output terminals. A second flip-flop being constructed in MOS technology receives a high supply voltage. The second flip-flop has a load segment and output terminals. At least one additional MOS transistor is connected in series with each of the output terminals of the second flip-flop between the load segment and ground. The at least one additional MOS transistor each has a gate terminal being connected to a respective one of the output terminals of the first flip-flip. A device for activating the first and second flip-flops is triggered for amplifying and holding the data to activate the first flip-flop and to activate the second flip-flop after a time delay.

7 Claims, 1 Drawing Sheet

CIRCUIT ARRAY FOR AMPLIFYING AND HOLDING DATA WITH DIFFERENT SUPPLY

This application is a continuation of application Ser. No. 08/118,028, filed Sep. 8, 1993 now abandoned.

BACKGROUND OF THE INVENTION

1. Field of the Invention

The invention relates to a circuit array for amplifying and holding data with different supply voltages.

Such circuits are for the most part constructed as bistable trigger circuits and have therefore been known for a long time. They are described, for instance, in the book by Tietze and Schenk entitled: Halbleiterschaltungstechnik [Semiconductor Circuitry], 1986, 8th edition, starting on p. 166.

Increasing semiconductor memory densities of integrated memories requires an ever-increasing packing density of memory cells and with it smaller transistors. For dependability reasons, the supply voltage of the minimal transistors must be reduced. However, the user wishes to operate with a supply voltage of 5 volts. Thus it has become necessary to reduce the supply voltage on the semiconductor memory. Consequently there are circuits on the memory that are operated with the external, high supply voltage, and circuits that operate with the internal, reduced supply voltage.

Semiconductor memories are organized in matrix arrays. Each individual memory cell can be addressed through a word line (WL) and a bitline pair (BL). Access to a memory cell of this type is effected by means of entering an address associated with the memory cell onto the semiconductor memory and entering a row address strobe (RAS) and a column address strobe (CAS). Usually the row or word address of the memory cell is selected with the RAS signal. Afterwards the column address is validated with the CAS signal, and the memory cell is thus fixed.

The memory cells addressed through a word line are read out and amplified. The bitline pairs selected through the column address are connected to a further line pair. They are generally referred to as external bitlines. In order to speed up the readout process, the signals to those lines are amplified and then switched further to the data output. In order to reduce the chip surface, the cell field includes a minimum of transistors and structures. The voltage is reduced in the cell field as described above. Therefore, it is necessary to accordingly adapt the voltage level of the data on the data path from the memory cell of data output.

SUMMARY OF THE INVENTION

It is accordingly an object of the invention to provide a circuit array for amplifying and holding data with different supply voltages, which overcomes the hereinafore-mentioned disadvantages of the heretofore-known devices of this general type and which evaluates data with a low supply voltage, amplifies them to a higher supply voltage and gives them off.

With the foregoing and other objects in view there is provided, in accordance with the invention, a circuit array for amplifying and holding data with different supply voltages, comprising a first flip-flop being constructed in MOS technology for receiving a low supply voltage and data with a low supply voltage, the first flip-flop having output terminals; a second flip-flop being constructed in MOS technology for receiving a high supply voltage, the second flip-flop having a load segment and output terminals, and at least one additional MOS transistor being connected in series with each of the output terminals of the second flip-flop between the load segment and ground; the at least one additional MOS transistor each having a gate terminal being connected to a respective one of the output terminals of the first flip-flip; and means for activating the first and second flip-flops, the activating means being triggered for amplifying and holding the data to activate the first flip-flop and to activate the second flip-flop after a time delay.

In accordance with another feature of the invention, the first flip-flop has two p-channel FETs and two n-channel FETs; the p-channel FETs have load segments connected to a low supply voltage and the n-channel FETs have load segments each being connected in a series circuit between a respective one of the load segments of the p-channel FETs and ground; the series circuits have node points, and each of the FETs in one of the series circuits has a gate terminal connected to the node point of the other of the series circuits; and the node points form respective input and output circuits.

In accordance with a further feature of the invention, the p-channel FETs have bulk terminals connected to the low supply voltage.

In accordance with an added feature of the invention, the second flip-flop has two further p-channel FETs and two further n-channel FETs; the further p-channel FETs have load segments connected to a pre-supply or pre-distribution voltage and the further n-channel FETs have load segments each being connected in a series circuit between a respective one of the load segments of the further p-channel FETs and ground; the series circuits have node points, and each of the further p-channel FETs in one of the series circuits has a gate terminal connected to the node point of the other of the series circuits; and the further n-channel FETs have gate terminals being respectively connected to input and output circuits of the first flip-flop.

In accordance with an additional feature of the invention, the activating means includes activation transistors for activating the first and second flip-flops, and including a logic circuit for assuring a time-delayed activation of the second flip-flop relative to the first flip-flop.

In accordance with a concomitant feature of the invention, the logic circuit includes a delay member in the form of an inverter stage.

The essential characteristics of the invention are that two flip-flops are interconnected in such a way that the overall array has an outer and an inner flip-flop. The inner flip-flop is operated in this case with the reduced operating voltage. The outer flip-flop is operated with the high supply voltage, such as 5 volts. The inner and outer flip-flops are connected only through the gate terminals of the outer flip-flop. The advantage of this structure is that the two different supply voltages can have absolutely no influence on each other.

Essentially, the array of the invention functions in the following manner, first, the inner flip-flop is activated, then the outer one. This can be effected by means of a simple logic circuit, for example, that generates two activation signals from one activation signal by means of a delay element, with one delayed and one undelayed signal that activate the respective flip-flop circuit.

Other features which are considered as characteristic for the invention are set forth in the appended claims.

Although the invention is illustrated and described herein as embodied in a circuit array for amplifying and holding data with different supply voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
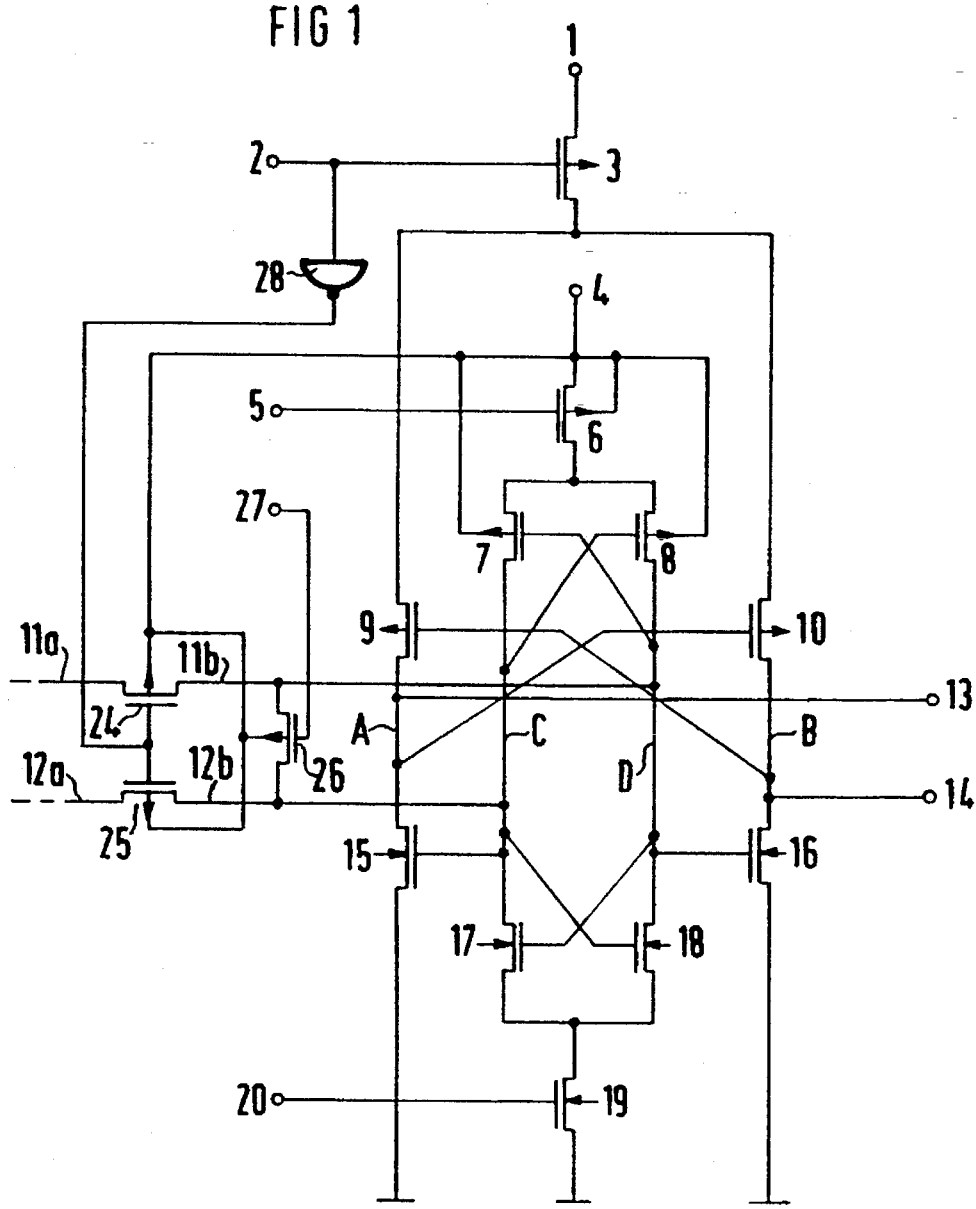
FIG. 1 is a schematic diagram of a circuit array in accordance with the invention.

Referring now to the figures of the drawing in detail and first, particularly, to FIG. 1 thereof, there is seen a supply voltage terminal 1 for a higher supply voltage, which is characterized by 5 volts, for example. The terminal 1 is connected to drain terminals of two p-channel FETs 9, 10 through a load segment of a p-channel activation transistor 3. A gate terminal of the activation transistor 3 is connected on one hand to a connection terminal 2 and on the other hand to an input of an inverter 28. A source terminal of the p-channel FET 9 is connected to ground through a load segment of an n-channel FET 15. Likewise, a source terminal of the p-channel FET 10 is connected to ground through a load segment of an n-channel FET 16. A gate terminal of the FET 9 is connected to a node point B of a series circuit of load segments of the FETs 10, 16, and a gate terminal of the FET 10 is connected to a node point A of a series circuit of load segments of the FETs 9 and 15. An input terminal 4 is shown to which a lower supply voltage, such as 3.3 volts, can be supplied. This input terminal 4 is connected to drain terminals of two p-channels FETs 7, 8 through a load segment of a p-channel activation transistor 6. Bulk terminals of the FETs 6, 7, 8 are likewise connected to the supply voltage terminal 4. A gate terminal of the FET 6 is connected to a connection terminal 5. A source terminal of the FET 7 is connected through a load segment of an n-channel FET 17 to a drain terminal of an n-channel activation FET 19. A source terminal of the FET 8 is likewise connected through a load segment of an n-channel FET 18 to the drain terminal of the FET 19. A source terminal of the n-channel FET 19 is connected to ground, and a gate terminal of the FET 19 is connected to a connection terminal 20. Gate terminals of the FETs 8, 18 are connected to a node point C of a series circuit of the load segments of the FETs 7 and 17. Likewise, gate terminals of the FETs 7 and 17 are connected to a node point D of a series circuit of the load segments of the FETs 8 and 18.

An external bitline indicated by reference symbols 11a, 11b is interrupted by a load segment of a p-channel FET 24, and an external bitline indicated by reference symbols and 12a, 12b is interrupted by a load segment of a p-channel FET 25, so that they are able to separate the external bitlines 11a, 12a from flip-flops. Gate terminals of the FETs 24, 25 are connected to an output of the inverter 28. Bulk terminals of the FETs 24, 25 are connected to the supply voltage terminal 4. In order to assure a potential equalization of the external bitline parts 11b, 12b during a precharge process, a further p-channel FET 26 is provided and has a load segment which is connected between the external bitline parts 11b, 12b. A gate terminal of the FET 26 leads to a connection terminal 27 and a bulk terminal thereof is in turn connected to the supply voltage terminal 4. In the process, the external bitline 11b is connected to the node point D of the series circuit of the load segments of the FETs 8 and 18, and the external bitline 12b is connected to the node point C of the series circuit of the load segments of the FETs 7 and 17.

Furthermore, the node point C of the series circuit of the load segments of the FETs 7, 17 is connected to a gate terminal of the FET 15, and the node point D of the series circuit of the load segments of the FET 8, 18 is connected to a gate terminal of the FET 16. Finally, the node point A is connected to an output terminal 13, and the node point B is connected to an output terminal 14. Data signals with the higher supply voltage can be picked up at the two output terminals 13, 14.

Figure 2:
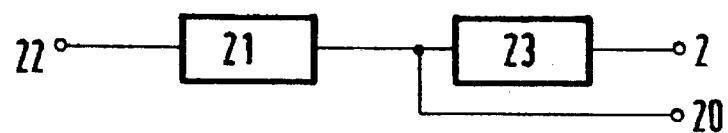
FIG. 2 is a block diagram of an embodiment of an activating circuit.

FIG. 2 shows an activation circuit for activating the inner and outer flip-flops. A connection terminal indicated by reference numeral 22 can be supplied with an activation signal for the evaluating circuit. This signal is supplied in turn to a logic array 21. This logic array 21 can generate non-illustrated output signals that serve to activate and deactivate the FETs 24, 25, 26, for example, as well as various non-illustrated control and evaluation devices of the memory array. Thus, among other things, the logic unit 21 generates the signal for activating the p-channel FET 6, because the actual activation process for the inner flip-flop is effected by means of the activation FET 19, and the activation process for the outer flip-flop is effected by means of the activation FET 3. The activation signal generated by the logic unit for activating the circuit array is supplied to the output terminal 20, which is identical to the terminal indicated by reference numeral 20 in FIG. 1. Moreover, this signal is conducted through a delay unit 23 to the connection terminal 2. The connection terminal 2 is likewise identical to the terminal shown in FIG. 1. In the simplest case, the delay unit 23 can be an inverter stage. An essential point is that the signal generated by the logic array 21 is inverted and delayed by a defined time period, with one gate running time or operating period being sufficient in this instance, so that the inner flip-flop is activated before the outer flip-flop.

Until a memory cell is fixed by CAS and the data output is released, the column address controls the reading process with the signal supplied to the input terminal 22. A plurality of signals are derived from this signal, among them being those supplied to the connection terminals 2 and 20.

The internal bitlines that are not shown and the external bitlines 11a, 11b, 12, 12b are precharged with a rising edge of the signal at the input terminal 22, and the evaluators are reset. The arrays used for precharging the bitlines are not shown in detail in FIGS. 1 and 2 and can be constructed in a standard manner. With its climbing edge, the signal at the connection terminal 22 likewise effects the occurrence of signals with climbing or falling edges at the connection terminals 20 and 2. These ensure that the inner flip-flop including the FETs 7, 8, 17, 18, and the outer flip-flop including the FETs 9, 10, 15, 16 are deactivated. Then the external bitlines 11, 12 are precharged at the lower supply voltage, and the outer data lines at the outputs 13, 14 are precharged at the higher supply voltage. The actual reading-out process of the addressed memory cell effects a difference signal on the external bitlines 11a, 11b, 12a, 12b. The bitline elements 11b, 12b are then separated from the external bitline parts 11a, 12a by the FETs 24, 25.

Now the actual evaluation process is executed by the circuit array with the falling edge of the signal at the input terminal 22. First the inner flip-flop 7, 8, 17, 18 is activated and displaces the outer flip-flop 9, 10 by one gate running time. After a further gate running time, as described above, the FETs 24, 25 are activated in such a way that they separate the external bitline parts from the two flip-flops. Through the use of the displaced activation, first the inner flip-flop operated by the reduced voltage is displaced. Then the outer flip-flop operated by the higher voltage and activated solely through the gate terminals of the transistors 15, 16 is set to correspond to the signals of the inner flip-flop.

The advantage of these flip-flops constructed one inside the other is the separation of the circuits operated with the lower supply voltage and the circuits operated with the higher supply voltage. The inner flip-flop is fixed by the n-channel transistors and the troughs of the p-channel transistors connected to the source of the lower voltage can likewise be connected there. This significantly improves the behavior of the circuits when the higher supply voltage is increased.

We claim:

1. A circuit array for amplifying and holding data, whereby the circuit array is connected to a low supply voltage and a high supply voltage, which voltages are different from one another and different from ground, the circuit array comprising:

a first flip-flop constructed in MOS technology for receiving the low supply voltage and data signals at input terminals with logical values varying within a range between the low supply voltage and ground, said first flip-flop having output terminals;

a second flip-flop constructed in MOS technology for receiving the high supply voltage, said second flip-flop having output terminals, and additional MOS transistors each connected between a respective one of the output terminals of said second flip-flop and ground;

said additional MOS transistors each having a gate terminal connected to a respective one of the output terminals of said first flip-flop; and means for activating said first and second flip-flops, said activating means being triggered to activate said first flip-flop and to activate said second flip-flop after a time delay while said first flip-flop remains activated for amplifying and holding the data.

2. The circuit array according to claim 1, wherein:

said first flip-flop has two p-channel FETs and two n-channel FETs;

said p-channel FETs each forming a series circuit between the low supply voltage and ground with a respective one of said n-channel FETs and wherein said n-channel FETs are connected to ground;

said series circuits each has a node point between a respective p-channel FET and n-channel FET, and each of said FETs in one of said series circuits has a gate terminal connected to the node point of the other of said series circuits; and the node points form respective input and output terminals.

3. The circuit array according to claim 2, wherein said p-channel FETs have bulk terminals connected to the low supply voltage.

4. The circuit array according to claim 1, wherein:

said second flip-flop has two further p-channel FETs, each of said further p-channel FETs is connected in a further series circuit with a respective one of said additional MOS transistors, and said additional MOS transistors are n-channel FETs;

said further series circuits each have a node point between a respective further p-channel FET and one of said additional MOS transistors and each of said further p-channel FETs in one of said further series circuits has a gate terminal connected to the node point of the other of said further series circuits.

5. The circuit array according to claim 2, wherein:

said second flip-flop has two further p-channel FETs, each of said further p-channel FETs is connected in a further series circuit with a respective one of said additional MOS transistors, and said additional MOS transistors are n-channel FETs;

said further series circuits each have a node point, between a respective further p-channel FET and one of said additional MOS transistors and each of said further p-channel FETs in one of said further series circuits has a gate terminal connected to the node point of the other of said further series circuits.

6. The circuit array according to claim 1, wherein said activating means includes activation transistors for activating said first and second flip-flops, and including a logic circuit for assuring a time-delayed activation of said second flip-flop relative to said first flip-flop.

7. The circuit array according to claim 6, wherein said logic circuit includes a delay member in the form of an inverter stage.

* * * * *